United States Patent [19]
Roth et al.

[11] Patent Number: 5,854,138
[45] Date of Patent: Dec. 29, 1998

[54] REDUCED-PARTICLE METHOD OF PROCESSING A SEMICONDUCTOR AND/OR INTEGRATED CIRCUIT

[75] Inventors: Peter Roth; Hector A. Molinar, both of Austin, Tex.

[73] Assignee: Cypress Semiconductor Corp.

[21] Appl. No.: 902,574

[22] Filed: Jul. 29, 1997

[51] Int. Cl.$^6$ ............................... H01L 21/00; B44C 1/22
[52] U.S. Cl. ............................ 438/714; 156/345; 216/67
[58] Field of Search ................................. 438/710, 714, 438/730; 156/345 P; 216/63, 67

[56] References Cited

U.S. PATENT DOCUMENTS

| | | | |
|---|---|---|---|
| 4,349,409 | 9/1982 | Shibayama et al. | 438/714 |
| 5,102,496 | 4/1992 | Savas | 156/345 X |
| 5,433,258 | 7/1995 | Barnes et al. | 438/714 X |
| 5,474,650 | 12/1995 | Kumihashi et al. | 438/714 |
| 5,549,786 | 8/1996 | Jones et al. . | |

*Primary Examiner*—William Powell
*Attorney, Agent, or Firm*—Kevin L. Daffer; Conley, Rose & Tayon

[57] ABSTRACT

A semiconductor and/or integrated circuit is provided having reduced particulate count upon or within the circuit. During power ramp down post etch or deposition, particles which formed within the plasma used to effectuate etch or deposition are gradually swept from the region above the integrated circuit. Plasma, and more specifically, the field which forms the plasma is maintained but at reduced levels to allow gradual reduction of particles through a multitude of steps. The steps culminate in eliminating power to the electrodes and plasma between the electrodes. However, at the time at which power is absent, only a few of the original particles remain in the critical region above the integrated circuit. Residual particles can be removed in a purge step following the successive sequence of ramp down steps. Gap between the electrodes is increased to a final position early in the ramp down sequence so that additional electrode movement does not occur when the field is weakened.

17 Claims, 4 Drawing Sheets

REDUCED-PARTICLE METHOD OF PROCESSING A SEMICONDUCTOR AND/OR INTEGRATED CIRCUIT

BACKGROUND OF THE INVENTION

1. Field of the Invention

This invention relates to fabrication of a semiconductor device (or integrated circuit) and more particularly to a method for controlling power, electrode separation and purge gas flow within a plasma reactor to minimize particulate accumulation upon the integrated circuit.

2. Description of the Related Art

An integrated circuit can be classified as containing materials, usually formed on a single monolithic substrate, having both electrically conductive and electrically insulative regions. The conductive regions, or conductors, are generally spaced from one another by the insulative regions, or insulators, except where a connection occurs. The conductors and insulators can be formed on multiple planes formed in sequence. Conductors on one plane may be selectively coupled among each other and to possibly conductors on other planes to form a circuit. Henceforth, an integrated circuit can be classified as any device which can actively and/or passively carry various electrical signals generally across a monolithic substrate.

Fabrication of an integrated circuit is generally well known as involving numerous processing steps. The steps are performed in a particular order and can be classified according to their function. For example, the steps may involve deposition, etch, implant, clean, etc.

There may be some commonalties involved in the deposition and etch steps. For example, certain types of deposition and etch involve reactions which occur within a plasma. For example, chemical vapor deposition ("CVD") may be plasma enhanced and therefore classified as PECVD. Further, etch may occur within a plasma utilizing not only chemical reaction but also assistance from atomic species directed upon the semiconductor device (or integrated circuit) surface. Still further, a plasma may be used between a target and the integrated circuit to sputter remove material from the target and transfer that material to the integrated circuit.

Depending on how the plasma is used and specifically its reaction to the integrated circuit surface will classify the step involving the plasma as either a deposition or an etch step. The plasma often called "glow discharge" may be generated by the application of an RF field to a low pressure gas. This may create reactive species (atoms, radicals, ions and/or electrons) within the discharge region. The reactive species can then be absorbed onto the integrated circuit surface. The radicals tend to have a high sticking coefficient, and also appear to migrate easily along the surface after absorption, for the benefit of a deposition step. Conversely, the reactive species may react chemically with the surface, to provide a volatile byproduct which can be swept away in an etch setting. Accordingly, depending on the species formed in the discharge area relative to the integrated circuit surface, either deposition or etch can occur.

A popular plasma-forming processing tool involves a pair of spaced electrodes. FIG. 1 illustrates an example of a processing tool 10 used in forming plasma between a pair of electrodes 12 biased relative to one another. For example, the upper electrode can be subjected to RF energy (at frequencies of 450 kHz–13.5 MHz) via an RF generator 14. The lower electrode, upon which one or more semiconductors and/or integrated circuits 18 are placed, may accommodate a ground voltage which may also be connected to the walls of reactor chamber 20.

Chamber 20 may be configured to receive one or more gases from a gas supply 22 via a gas control unit 24. The gases react in the discharge region to form the reactive species used to etch, or deposit upon, the integrated circuit surface.

The byproduct of the plasma absorption upon the integrated circuit surface may be removed through a vacuum pump 26. Vacuum amount may be controlled by a throttle valve 28 to ensure consistent draw of the byproduct from chamber 20. FIG. 1 illustrates an example of one type of configuration used to form a plasma or glow discharge region. It is understood, however, that numerous configurations can be used provided sufficient energy is present between electrodes to produce and maintain discharge area and/or plasma field. This implies possibly numerous configurations of the reactor chamber as well as the electrodes (either in size, shape or arrangement with respect to one another). According, a plasma used in either a deposition or etch step can be produced within a parallel-plate reactor, a barrel reactor, a downstream reactor, or a batch (i.e., hexode) reactor, for example.

Regardless of the configuration used, processing tools which form a plasma often incur particulate matter, or particles, within the plasma. Depending upon their size and magnetic properties, the particles may be somewhat held within the plasma field during times when discharge is present. Those particles mostly remain in the field generally above the integrated circuit provided sufficient field energy is present. However, once RF energy is reduced below a critical level, the particles will fall from the field to an underlying integrated circuit depending on the size, etc., of the particles involved.

FIGS. 2 and 3 illustrate the problem of particulate accumulation during power ramp down of a plasma reactor. Specifically, FIG. 2 depicts a pair of electrodes 12a and 12b spaced from one another. In the region between biased electrodes 12 is a plasma 30. A field is believed to retain the plasma in the position shown due, in part, to a negative self-bias voltage developed on electrode 12b relative to the ground voltage upon electrode 12a. A potential difference therefore occurs of equal magnitude across a "dark space" adjacent the grounded electrode and, specifically, adjacent the upper surface of integrated circuit 18. It is believed that reactive species traverse the dark space between plasma 30 and the surface of integrated circuit 18, while relatively small particles 32 somewhat retain their position within plasma 30. Without being bound to theory, it is postulated that particulates 32 may not retain sufficient charge to allow them to be attracted, at least not at the same level as the reacted species. Thus, while the etch/deposition process occurs, and electrodes are powered, particles 32 near the center of field 30 do not substantially fall upon integrated circuit 18.

However, once energy is removed at the culmination of the etch/deposition step, it is believed the gravitational force will draw particles 32 downward. The drawn particles 32 are believed to either directly or indirectly fall upon integrated circuit and/or wafer 18. Thus, as the self-biased voltage upon electrode 12b is reduced and the potential difference within the plasma is correspondingly reduced, particulate accumulation becomes a problem. Whatever particles might exist within the plasma either fall upon the chamber walls, and eventually wafer 18, or fall directly upon wafer 18.

Particles 32 can be derived from numerous sources and can be composed of numerous atomic and elemental compositions. Purely as one example, particles are a natural result of fluorine within the inlet gas reacting with exposed aluminum on the chamber walls. Fluorine may react with aluminum to form aluminum fluoride which eventually flakes from the walls and resides within the plasma. As another example, particulates may arise from upstream components, conduits and delivery systems containing heavy metals (e.g., Fe, Cr and Ni). Yet further, particles may be generated directly within the polymeric residues of the reactive gases, such as would be the case if a halogen deficiency occurs in the halocarbon plasmas used in a plasma etch species. Still further, the wafer surface itself may source particles, possibly of numerous composition and elemental structures. For example, aluminum fluoride may arise from etchant attacking aluminum interconnect exposed at the culmination of, e.g., a dielectric etch upon the wafer.

Whatever causes the particles to occur cannot easily be controlled without substantial changes to the processing tool system as a whole, or without changing the nature of the chemical material and/or delivery system. A more suitable alternative would be to minimize the mechanism by which particles are delivered to the integrated circuit post etch/deposition. Thus, an improved technique is needed for reducing particle accumulation on the integrated circuit topography, and the deleterious effects of those particles in the overall formation and/or operation of the integrated circuit.

SUMMARY OF THE INVENTION

The problems outlined above are in large part solved by an improved power ramp down process. The power ramp down process involves iterative steps which occur after the etch or deposition step is substantially concluded. More specifically, the power ramp down process involves not only iterative steps, each involving a discrete power reduction, but also involves a controlled separation of electrodes early in the step sequence. Throughout electrode separation and/or power reduction, reactive-type gas flow is maintained.

The stepped reduction in power effectuates a gradual decrease in plasma and the particle-entrained field associated therewith. Reducing the field while maintaining gas flow allows the particles to be gradually swept from the space between the electrodes. As the field energy is further decreased, the gas flow force will overcome the force which retains particles within the gap. If the field were to abruptly stop, gas flow may not be sufficient to sweep the particles prior to them falling upon the integrated circuit. Accordingly, reduction in field energy must be gradual and must be carried out at a particular rate relative to the gas flow rate proximate to or between electrodes.

The benefit of reducing power and sweeping particles during that reduction is brought about, in part, by increasing the spacing between electrodes early in the power down sequence. Separating the electrodes by, for example, placing the electrodes in a "home" position ensures sufficient gap distance to allow gas traversal. Increasing the gap distance will help reduce the plasma energy early in the ramp down sequence but, more importantly, allows more gas flow through the weakened plasma field.

The iterative steps of removing power is eventually culminated when a zero voltage is applied to the upper electrode relative to the lower electrode. As such, the potential difference within the plasma is substantially eliminated, causing the plasma to extinguish possibly concurrent with a purge gas introduced between the electrodes. The purge gas is preferably an inert gas possibly altogether different from the previous gas forwarded between the electrodes (i.e., the previous gas being a reactive gas in an etch/deposition step, or an inert gas in a sputter step). The purge gas helped sweep any residual particles from the reaction chamber to the vacuum pump or load locks placed in communication with the chamber.

Broadly speaking the present invention concerns a method for reducing particulate placement upon an integrated circuit. The method comprises biasing a pair of electrodes within a processing tool. A first amount of power is then removed from the electrodes while separating the electrodes. A second amount of power is thereafter removed from the electrodes. Removing the first amount of power and separating the electrodes occur during a first interval whereas removing the second amount of power occurs during a second interval subsequent to the first interval. The present invention further concerns an alternative embodiment wherein power is removed in stepped increments from a pair of biased electrodes while maintaining a flow of gas therebetween.

The present invention yet further concerns an embodiment for fabricating a semiconductor wafer. The method includes inserting the semiconductor wafer between a separated pair of electrodes. The electrodes are then biased while flowing a gas proximate the electrodes to form a plasma adjacent the semiconductor wafer. The plasma is then reduced at a relatively constant rate by lowering the biasing of the electrodes and increasing the separation between the electrodes. The plasma is further reduced at a relatively constant rate by further lowering the biasing of the electrodes. A flow of gas is maintained during the time in which the plasma is reduced.

BRIEF DESCRIPTION OF THE DRAWINGS

Other objects and advantages of the invention will become apparent upon reading the following detailed description and upon reference to the accompanying drawings in which.

Figure 1:
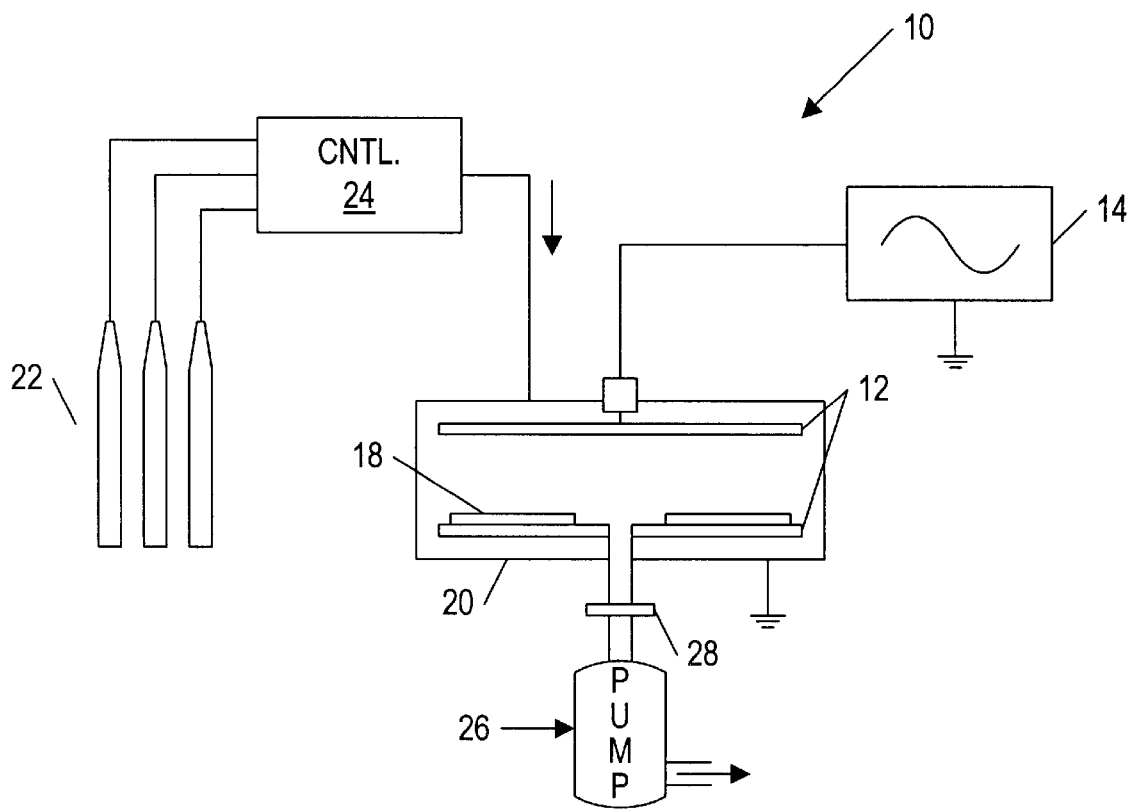
FIG. 1 is a plan view of a processing tool used to produce a plasma between a pair of electrodes.
Figures 2, 3:
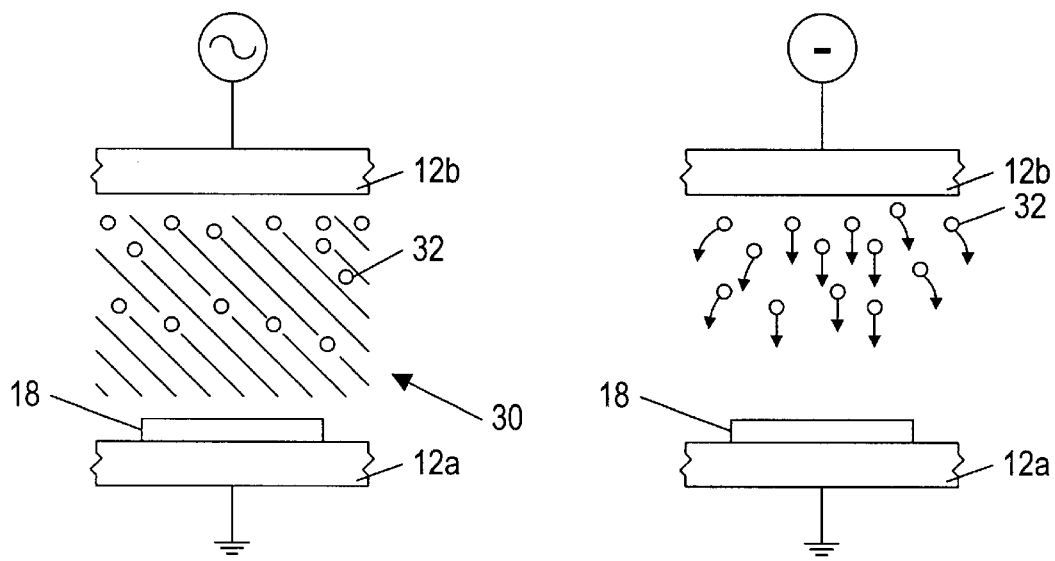
FIG. 2 is a side elevational view of particulate-containing plasma formed between a biased pair of electrodes.
FIG. 3 is a side elevational view of particles directed upon a semiconductor wafer upon removing power from the electrodes.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to FIGS. 4–8, a sequence of steps are shown indicating a power ramp down sequence according to an embodiment of the present invention. The power ramp down sequence occurs over numerous steps from an initial power used by the electrodes to carry out etch/deposition. Power is reduced in stepped iterations while maintaining gas flow between the electrodes. The gas within the gas flow is that used to produce the plasma which reacts with the integrated circuit topography during etch/deposition. Thus, even though a reactive gas may be employed during the sequence of steps, the reactive gas has a reduced effect (i.e., etch/deposition) upon the integrated circuit topography due to the lessened plasma (or power) between the electrodes.

Figure 4:
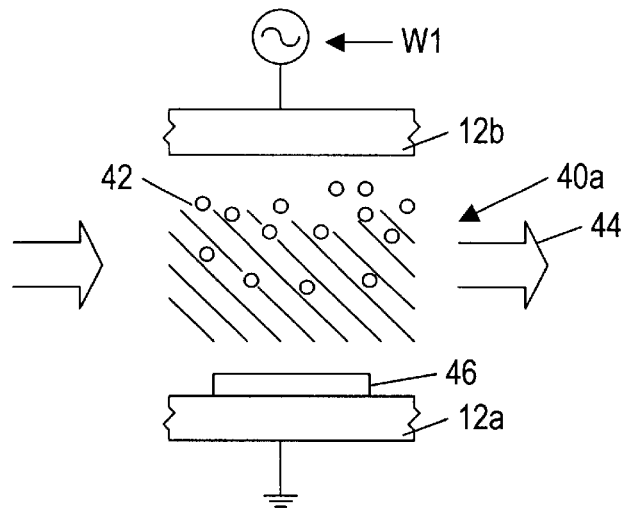
FIG. 4 is a side elevational view of a pair of electrodes biased to an amount W1, while maintaining gas flow therebetween.

The initial step of the sequence begins by assuming the etch/deposition cycle is concluded, or substantially concluded, yet a plasma nonetheless remains between electrodes 12, shown in FIG. 4. Accordingly, the power shown as W1 on the upper electrode 12b is that used at the conclusion of the etch/deposition cycle. For example, W1 can be approximately 1000 watts when used, e.g., to etch through a dielectric above a relatively large integrated circuit input/output pad. According to another example, power W1 can be approximately 695 watts when etching through a dielectric above a relatively small interlevel contact area. A pad region may require a greater amount of power to clear additional dielectric upon the pad relative to dielectric upon a contact area, for example. Accordingly, the power level W1 can vary depending on its application, and depending on whether an etch or a deposition step is used.

It is noted that plasma 40a shown in FIG. 4 contains numerous particles 42. If power W1 is substantially large, then particles 42 are retained within the field by which plasma 40a is formed. As described above, particles 42 are derived from numerous sources inherent in an etch/deposition plasma-induced reactor. A reactive species is sourced from a gas flow 44 passing proximate to, near, adjacent and/or between electrodes 12. If the reactor produces a plasma etch, then gas flow 44 may contain a fluorocarbon. Alternatively, gas flow 44 may contain an inert species if a physical sputter etch or a sputter deposition is used. Yet further, a silane ($SiH_4$) or silica may be used within gas flow 44 to deposit a silicon-based thin film. It is therefore understood that gas flow 44 contains any species needed to deposit and/or etch an upper surface of a semiconductor wafer 46. As such, gas within gas flow 44 is henceforth referred to as a "reactive gas".

Figure 5:
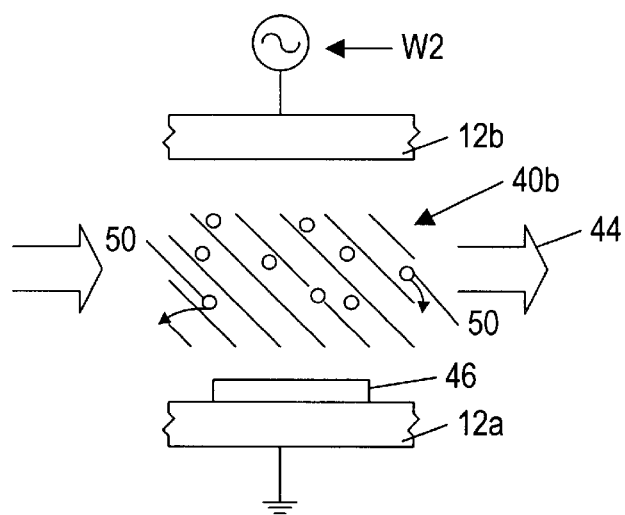
FIG. 5 is a side elevational view of the pair of electrodes biased to an amount W2 less than the W1, while increasing separation between electrodes and maintaining gas flow therebetween.

FIG. 5 illustrates a ramp down sequence subsequent to FIG. 4, whereby power is reduced from W1 to W2 and/or electrodes 12 are separated. According to one embodiment, power is reduced concurrent with electrode separation. According to another embodiment, electrodes 12 are separated prior to a reduction in power. For example, the electrodes can be moved from a position in which they are less than 1.0 cm apart to a position approximately equal to or greater than 1.35 cm apart. Concurrent with or subsequent to an increase in gap distance, power may be reduced approximately 100 watts per second, according to one embodiment. If the gap distance is increased between electrodes 12 prior to power reduction, gap increase may occur over approximately 3.0 seconds while power reduction can occur over approximately 2.0 seconds. Of course, the change in gap distance and the rate of power reduction can vary depending upon the rate of plasma reduction and a desired distance between electrodes 12. The gap distance between electrodes 12 is preferably enhanced to allow a greater intermingling of gas flow 44 between the electrodes and to allow ingress to wafer 46 by an operator post ramp down. Preferably, gap distance is increased to a "home" position where wafer 46 can be removed without having to the further move the electrodes. Separating the electrodes early in the power ramp down sequence allows particulates formed during that move to stabilize within the plasma when the plasma is of sufficient energy to retain those particles. If the electrodes move later in the power ramp down sequence, a weakened plasma field may not be sufficient to retain particles dislodged during the move. Thus, the gap between electrodes 12 increases and remains fixed in the increased position early in the power down sequence.

Plasma 40b shown in FIG. 5, and specifically the field of plasma 40b, is less than the field of plasma 40a shown in FIG. 4. Therefore, while the overall field is retained, it is lessened from that shown in FIG. 4 to that of FIG. 5. The weakened field allows certain particles within the plasma to be drawn from the plasma by gas flow, and possibly by gravitational forces as well. Of benefit, however, is the retained gas flow 44 which sweeps the particles as they fall. Gas flow 44 preferably moves the falling particles 50 from between electrodes 12 so that they do not fall upon wafer 46. Accordingly, it is preferred that gas flow 44 be maintained relatively constant throughout the power ramp down sequence.

Figure 6:
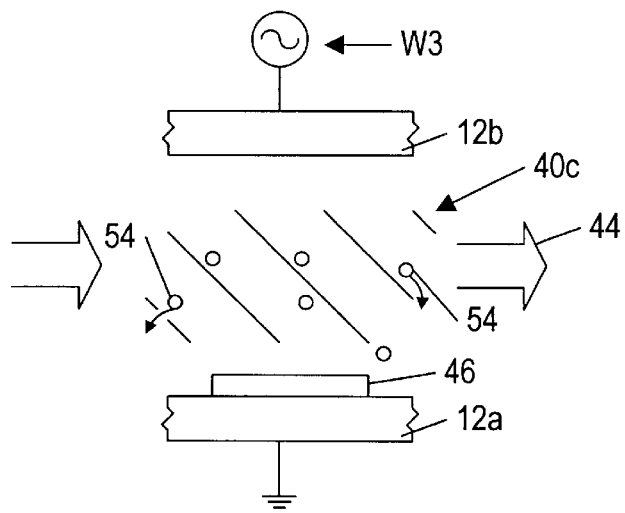
FIG. 6 is a side elevational view of the pair of electrodes biased to an amount W3 less than W2, while maintaining gas flow therebetween.

FIG. 6 illustrates a power ramp down subsequent to FIG. 5, whereby power is further reduced to W3 from W2. Reduction in power occurs over a specified interval which, according to one exemplary embodiment, is approximately 2.0 seconds. For example, power is reduced from W2 to W3 by approximately 200 watts during, for example, the 2.0 second interval. A reduced field and/or plasma 40c results from the lessening of power. This may allow certain particles 54 to be drawn in the direction indicated. However, the fall particles are swept as they fall by the relatively constant gas flow 44. It is important to note that the retaining field may be slightly weaker near the edge of the field outside the perimeter of semiconductor wafer 46. Accordingly, it is believed that a majority of particles fall typically fall outside the wafer perimeter. Particles near the center of the wafer are retained in the slightly greater field and therefore do not fall unless power is further reduced. Whatever particles fall outside the perimeter of the wafer can be more easily swept away at the outer plasma fringes.

Figure 7:
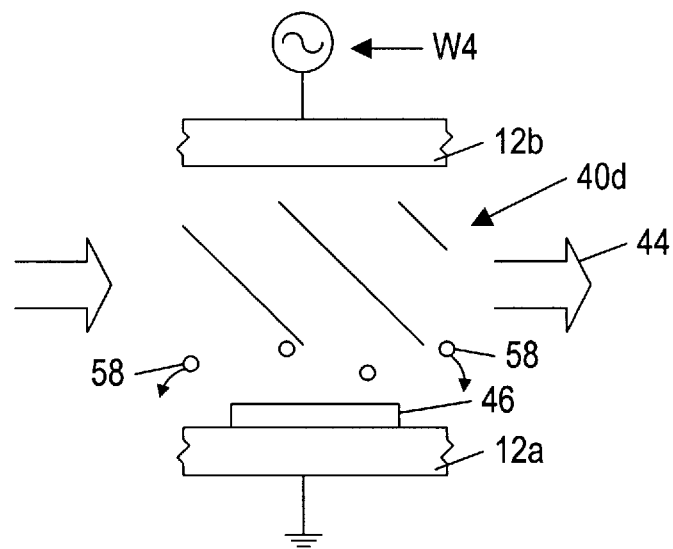
FIG. 7 is a side elevational view of the pair of electrodes biased to an amount W4 less than W3, while maintaining gas flow therebetween.

Referring to FIG. 7, a processing step directly or indirectly subsequent to FIG. 6 is shown. Depending on the initial power applied to the upper electrode 12b, the number of power reduction steps may change. For example, if the initial power is 1000 watts, and if each step involves a 200 watt drop, then approximately 5 power ramp down steps may be used. Conversely, if the initial power is approximately 600 watts, then only three power ramp down steps may be needed. If each power ramp down reduction is fairly small (e.g., less than 200 watts) then more steps may be required. Regardless of the number of steps, each power ramp down step involves a reduction of power while at least maintaining gas flow 44. It is speculated that an increase in gas flow during this stage might actually help remove additional particles. The culmination of two or more steps is shown in FIG. 7, whereby power W4 is less than power W3 to cause a further weakening of the field used to form plasma 40d and specifically, the field used to retain particles therein. As shown in FIG. 7, the particles respond to gravitational force to a greater degree than when the field is stronger. Thus, the particles are shown nearer the lower electrode 12a than those particles shown in previous FIGS. 4 through 6. Plasma 40d may still retain sufficient energy to retain particles near the center of wafer 46, yet allows particles 58 near the wafer perimeter to be swept away by gas flow 44.

Figure 8:
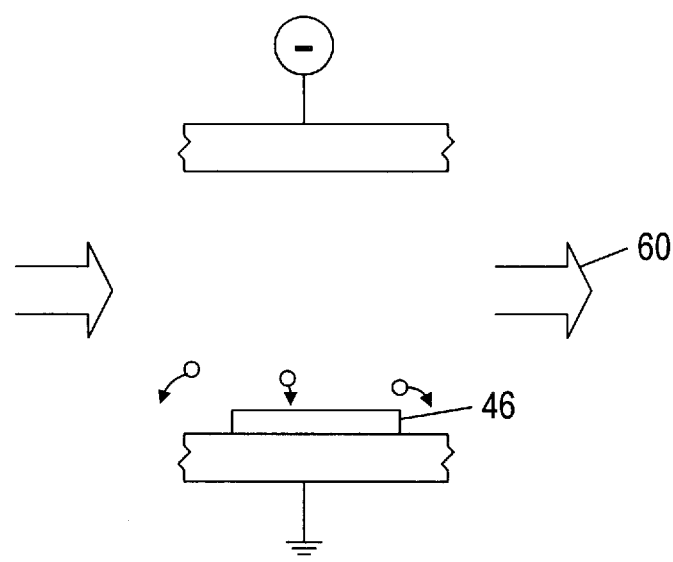
FIG. 8 is a side elevational view of the pair of electrodes absent biasing while initiating a purge gas flow to remove a substantially reduced particulate count from between the electrodes.

It is not until, however, the field is substantially reduced below the gravitational field that particles will substantially drop upon semiconductor wafer 46. Meanwhile, a substantial percentage of particles within the field are removed during the previous ramp down steps. FIG. 8 illustrates elimination of power from upper electrode 12b and the effect of minimized, residual particulates falling upon wafer 46. Concurrent with, or slightly subsequent to removing power from electrode 12b is the introduction of a purge gas into the reaction chamber, according to one embodiment. The purge gas and, specifically, purge gas flow, is shown as reference numeral 60. Purge gas comprises any gas which is not a reactive gas and, more specifically, comprises an inert gas. Examples of suitable inert gases include nitrogen, helium and/or argon. According to a preferred embodiment, the purge gas comprises helium forwarded, for example, at a flow rate of approximately 200 sccm or greater. Purge gas flow 60 helps sweep any residual particles from the reaction chamber, and not just those particles existing on the upper surface of semiconductor wafer 46. According to one example, the purge step can occur absent power upon electrodes for approximately 15 to 30 seconds. The purge step may, if desired, extend for a time duration greater than each of the power ramp down steps and/or the gap enhancement step.

Figure 9:
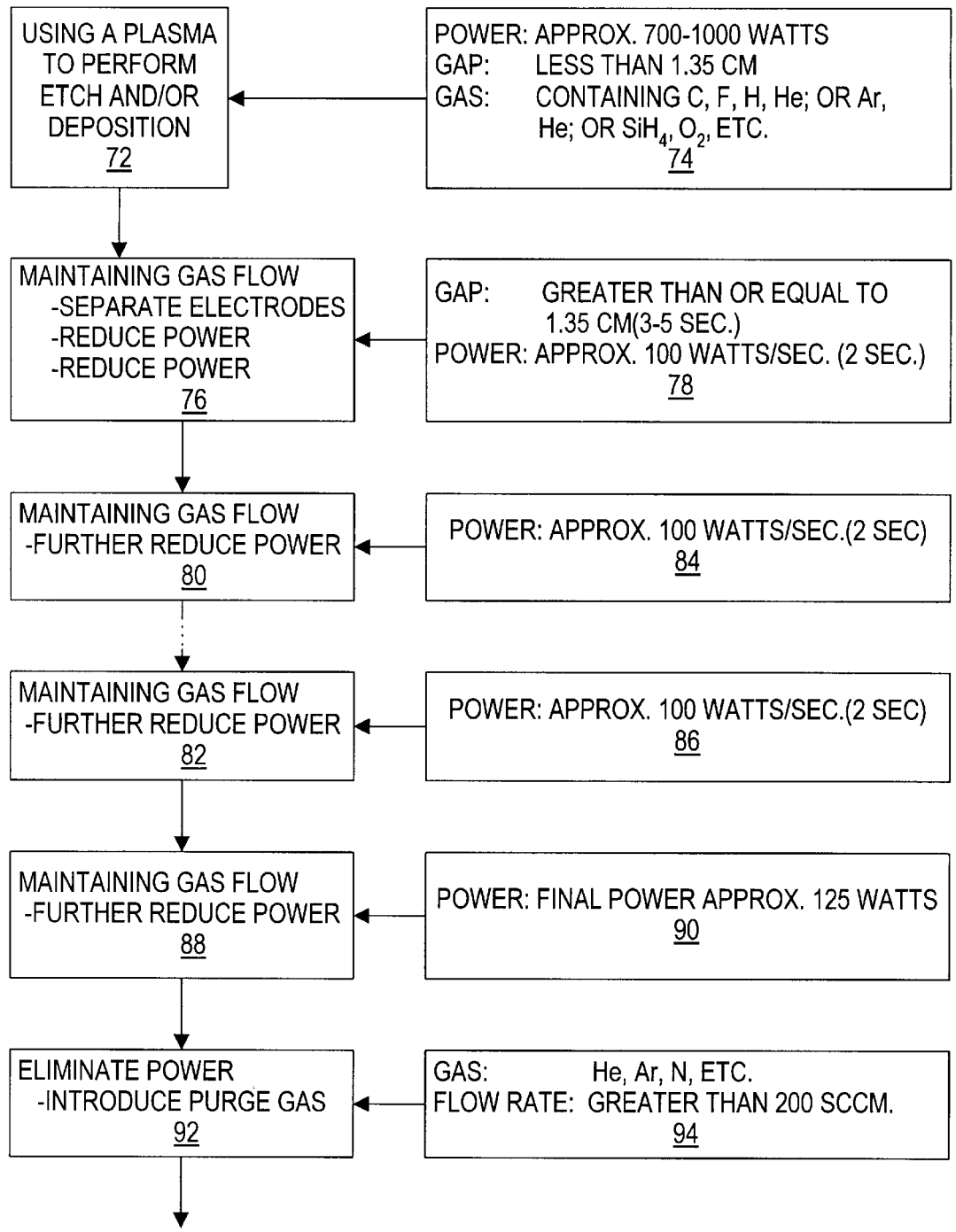
FIG. 9 is a flow diagram of a power ramp down sequence according to an embodiment of the present invention.

Turning now to FIG. 9, a flow diagram of an exemplary power ramp down sequence 70 is shown. Sequence 70 begins with the culmination of an etch and/or deposition cycle 72. Etch can occur separate from or concurrent with deposition, the latter instance often referred to as anisotropic deposition or high density plasma deposition sourced from, e.g., transformer coupled plasma ("TCP"), or inductively coupled plasma ("ICP"), etc. Plasma generated between electrodes in an etch/deposition chamber can be produced, for example, from electrodes powered between 250 to 1200 watts. The gap between electrodes can be made larger than 1.35 cm, and the reactant gas can include an etch species, a deposition species, or an inert species used primarily in sputter deposition or as a "carrier gas" used in a plasma etch environment. Exemplary power, gap and gas amounts are shown in block 74.

Subsequent to step 72 is a step 76 which occurs by reducing the power provided to the electrodes either concurrent with or subsequent to separating the electrodes. Step 76 is carried out while maintaining the gas flow of the reactant gases. If the electrodes are moved, the moved electrodes are spaced preferably at a home position greater than 1.35 cm. Movement of electrodes can occur during a 3.0 to 5.0 second interval, or whatever time is needed to physically move the electrodes to their home position. During movement, power may be reduced over a 2.0 second interval using, for example, a 100 watt per second reduction rate, as shown in block 78. Further reductions in power can occur among several steps, two of which are shown as reference numerals 80 and 82. Each reduction in power can occur at approximately the same rate (e.g. 100 watts per second over 2.0 seconds) as shown in blocks 84 and 86.

Power is reduced in a final step shown as reference numeral 88 to a value greater than zero. According to one example, the final power may be approximately 125 watts as shown in block 90. Power of 125 watts is merely an example given the conditions called forth herein, and wherein power of 125 watts is approximately the minimum power believed to sustain the plasma field given the final electrode spacing, gas flow, gas mixture and pressure conditions culminating in block 90. Throughout each power reduction step, power may be reduced at approximately the same rate. A stabilization step is generally not desired between power reduction steps. However, if an existing process having stabilization is retrofitted with the present steps, it is desired that stabilization not negatively affect the present sequence of particle reduction conditions. The final power amount may be insufficient to retain the remaining particles. However, those remaining particles, as well as other particles, which have dropped upon the semiconductor wafer may be removed by a purge step 92. The purge step occurs while power is substantially removed from the electrodes. The purge gas is preferably an inert gas, such as nitrogen, helium, argon, etc. According to one embodiment, the purge gas flow rate is greater than 200 sccm, as shown in block 94.

It will be appreciated to those skilled in the art having the benefit of this disclosure that this invention is believed applicable to any semiconductor and/or integrated circuit prepared by one or more steps involving a deposition and/or etch process. Furthermore, it is to be understood that the form of the invention shown is to be taken as exemplary, presently preferred embodiments. Regardless of the processing tool, reactor configuration and/or application the present invention is suited for any process involving power ramp down from a plasma state to a state substantially void of plasma. To that end, the specification and drawings are to regarded in an illustrative rather than a restrictive sense.

What is claimed is:

1. A method for reducing particulates derived from within a processing tool, comprising:

providing a processing tool comprising a pair of biased electrodes;

removing a first amount of power from said electrodes while separating said electrodes; and removing a second amount of power from said electrodes.

2. The method as recited in claim 1, wherein said removing the first amount of power and separating said electrodes occur during a first interval.

3. The method as recited in claim 1, wherein said removing the first amount of power comprises reducing only a portion of power supplied to said electrodes during a first interval.

4. The method as recited in claim 3, wherein said removing the second amount of power comprises reducing only a portion of power supplied to said electrodes during a second interval subsequent to said first interval.

5. The method as recited in claim 4, wherein said removing the first and second amounts of power occur at a substantially equal rate throughout the first and second intervals, respectively.

6. The method as recited in claim 4, wherein said first interval is approximately two to five seconds, and wherein said second interval is approximately two to five seconds.

7. The method as recited in claim 1, further comprising maintaining a flow of gas between said electrodes during both said removing steps.

8. The method as recited in claim 7, wherein said gas comprises an inert gas.

9. The method as recited in claim 7, wherein said gas comprises an etchant gas.

10. The method as recited in claim 7, wherein said gas comprises a precipitate gas.

11. The method as recited in claim 1, further comprising a semiconductor wafer interposed between said pair of electrodes.

12. A method for reducing particulates derived from within a processing tool, comprising removing power in stepped increments from a pair of biased electrodes while maintaining a flow of gas therebetween.

13. The method as recited in claim 12, wherein said removing comprises reducing power approximately 100 watts per second over at least two steps separated in time.

14. The method as recited in claim 12, wherein said flow of gas comprises a flow of fluorocarbon-containing gas.

15. The method as recited in claim 12, further comprising introducing a purge gas between said electrodes after said power is substantially removed.

16. A method for fabricating a semiconductor wafer, comprising:

inserting the semiconductor wafer between a separated pair of electrodes;

biasing said electrodes while flowing a gas proximate the electrodes to form a plasma adjacent said semiconductor wafer;

reducing at a relatively constant rate said plasma by lowering the biasing of said electrodes and increasing the separation between said electrodes;

further reducing at a relatively constant rate said plasma by further lowering the biasing of said electrodes; and maintaining said flow of gas during said reducing and further reducing steps.

17. The method as recited in claim 16, further comprising forwarding a purging gas proximate the electrodes after said maintaining step.

* * * * *